United States Patent
Zhu

(10) Patent No.: US 9,430,005 B2
(45) Date of Patent: Aug. 30, 2016

(54) SERVER

(71) Applicant: WISTRON CORP., New Taipei (TW)

(72) Inventor: Chong-Xing Zhu, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 14/716,597

(22) Filed: May 19, 2015

(65) Prior Publication Data

US 2016/0205803 A1 Jul. 14, 2016

(30) Foreign Application Priority Data

Jan. 13, 2015 (CN) .......................... 2015 1 0017442

(51) Int. Cl.
*H05K 5/00* (2006.01)
*H05K 7/16* (2006.01)
*G06F 1/18* (2006.01)
*H05K 7/14* (2006.01)

(52) U.S. Cl.
CPC .............. *G06F 1/188* (2013.01); *G06F 1/181* (2013.01); *H05K 7/1489* (2013.01); *H05K 7/1492* (2013.01)

(58) Field of Classification Search
CPC ..... G06F 1/181; G06F 1/188; H05K 7/1489; H05K 7/1492
USPC ................................................ 361/724–727
See application file for complete search history.

(56) References Cited

U.S. PATENT DOCUMENTS

| | | | | |
|---|---|---|---|---|
| 5,761,045 A * | 6/1998 | Olson | .................. | H01R 13/629 312/223.2 |
| 5,777,848 A * | 7/1998 | McAnally | .............. | G06F 1/188 312/223.2 |
| 5,790,372 A * | 8/1998 | Dewey | .................... | G06F 1/189 312/223.2 |
| 7,354,293 B2 * | 4/2008 | Liang | ................... | H05K 7/1411 361/727 |
| 7,586,748 B2 * | 9/2009 | Chen | .................... | H05K 7/1411 16/110.1 |
| 7,654,844 B1 * | 2/2010 | Wormsbecher | .. | H01R 13/62938 361/727 |
| 2003/0043549 A1 * | 3/2003 | Chen | ....................... | G06F 1/184 361/724 |
| 2013/0039019 A1 * | 2/2013 | Lu | ........................... | H05K 7/02 361/736 |
| 2015/0282375 A1 * | 10/2015 | Kao | ..................... | H05K 7/1487 312/223.6 |

FOREIGN PATENT DOCUMENTS

| | | |
|---|---|---|
| TW | M376462 U1 | 3/2010 |
| TW | M445712 U | 1/2013 |
| TW | M483461 U | 8/2014 |

OTHER PUBLICATIONS

Taiwan Office Action dated Nov. 24, 2015 in application No. 104104144.

* cited by examiner

*Primary Examiner* — Nidhi Thaker
(74) *Attorney, Agent, or Firm* — Maschoff Brennan

(57) ABSTRACT

A server includes a casing, a circuit board component, an assembly component and a power supply. The casing has an assembly channel and a first fastening slot. The circuit board component includes a substrate and a first electrical connector. The first electrical connector is electrically connected to the substrate. The assembly component is located out of the casing and detachably assembled with the casing. The assembly component has a second fastening slot. A distance between the first electrical connector and the second fastening slot is greater than a distance between the first electrical connector and the first fastening slot. The power supply includes a main body and a fastening unit. The main body includes a second electrical connector. The main body is for being movably assembled with the assembly channel, so the fastening unit is selectively assembled with the first fastening slot or the second fastening slot.

10 Claims, 17 Drawing Sheets

SERVER

CROSS-REFERENCE TO RELATED APPLICATIONS

This non-provisional application claims priority under 35 U.S.C. §119(a) on Patent Application No(s). 201510017442.1 filed in China on Jan. 13, 2015, the entire contents of which are hereby incorporated by reference.

BACKGROUND

1. Technical Field

The disclosure relates to a server. More particularly, the disclosure relates to a server with a detachable assembly component.

2. Background

With the development of technology, all kinds of servers, such as 2U servers, rack-mount servers, blade servers or tower servers, have been widely used by individuals and organizations.

Generally speaking, to prevent from being shut down unexpectedly, the server is usually equipped with two power supplies. One is for supplying power to the server. The other one is regarded as a spare power supply, for supplying power to the server when the server is shut down due to a power outage. The power supplies are electrically connected to the main circuit board of the server for providing power to other electronic components thereof. During transport, the electrical connection of the power supplies and the main circuit board may be damage due to collisions.

SUMMARY

One aspect of the disclosure provides a server which includes a casing, a circuit board component, an assembly component and a power supply. The casing has at least one assembly channel and at least one first fastening slot. The assembly channel is for providing a motion path. The first fastening slot is located at one side of the assembly channel. The circuit board component is disposed inside the casing and includes a substrate and at least one first electrical connector. The first electrical connector is fixed and electrically connected to the substrate, and located at the motion path. The assembly component is located out of the casing and detachably assembled with the casing. The assembly component has a second fastening slot located within the motion path where the first fastening slot is located. A distance along the motion path between the first electrical connector and the second fastening slot is greater than a distance along the motion path between the first electrical connector and the first fastening slot. The power supply includes a main body and at least one fastening unit connected to the main body. The main body includes a second electrical connector for being combined with the first electrical connector. The main body is for movably assembled with the assembly channel of the casing, such that the fastening unit is selectively assembled with the first fastening slot or the second fastening slot. When the fastening unit is fastened with the first fastening slot, the second electrical connector is combined with the first electrical connector and maintained at a first position. When the fastening unit is fastened with the second fastening slot, the second electrical connector is separated from the first electrical connector and at a second position.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1A:
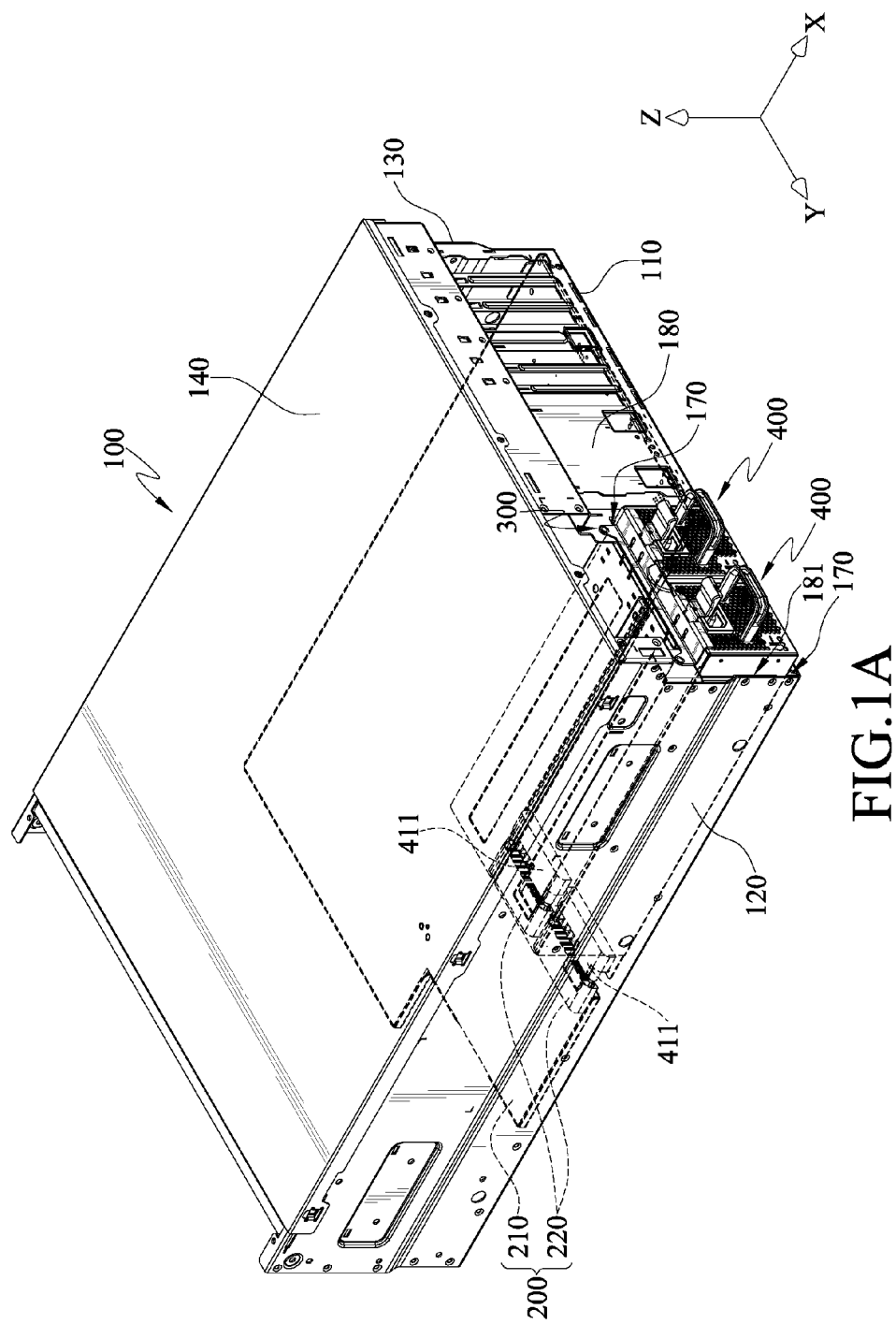
FIG. 1A is a perspective view of a server according to a first embodiment of the disclosure.
Figure 1B:
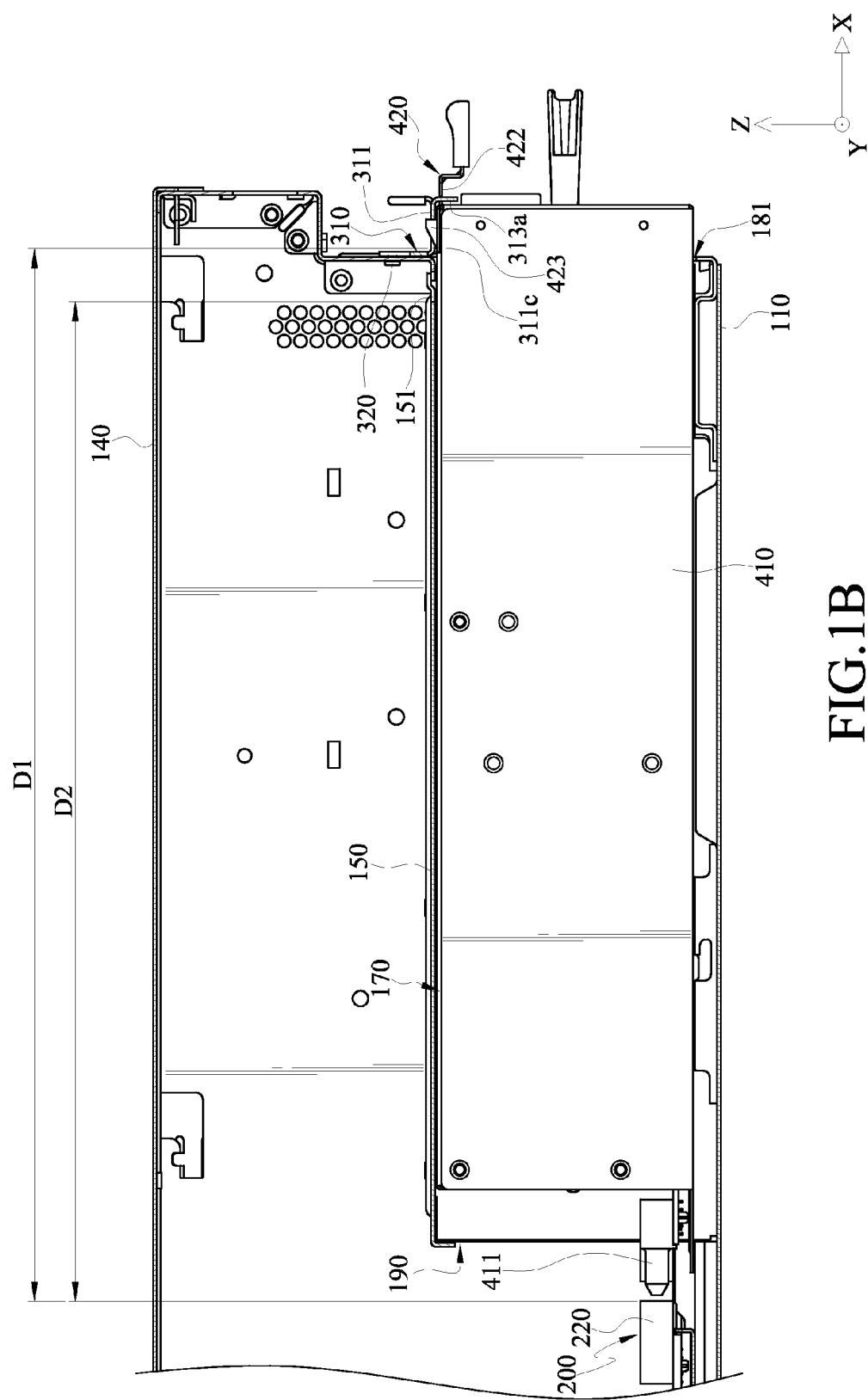
FIG. 1B is a cross-sectional view of the server in FIG. 1A.
Figure 2:
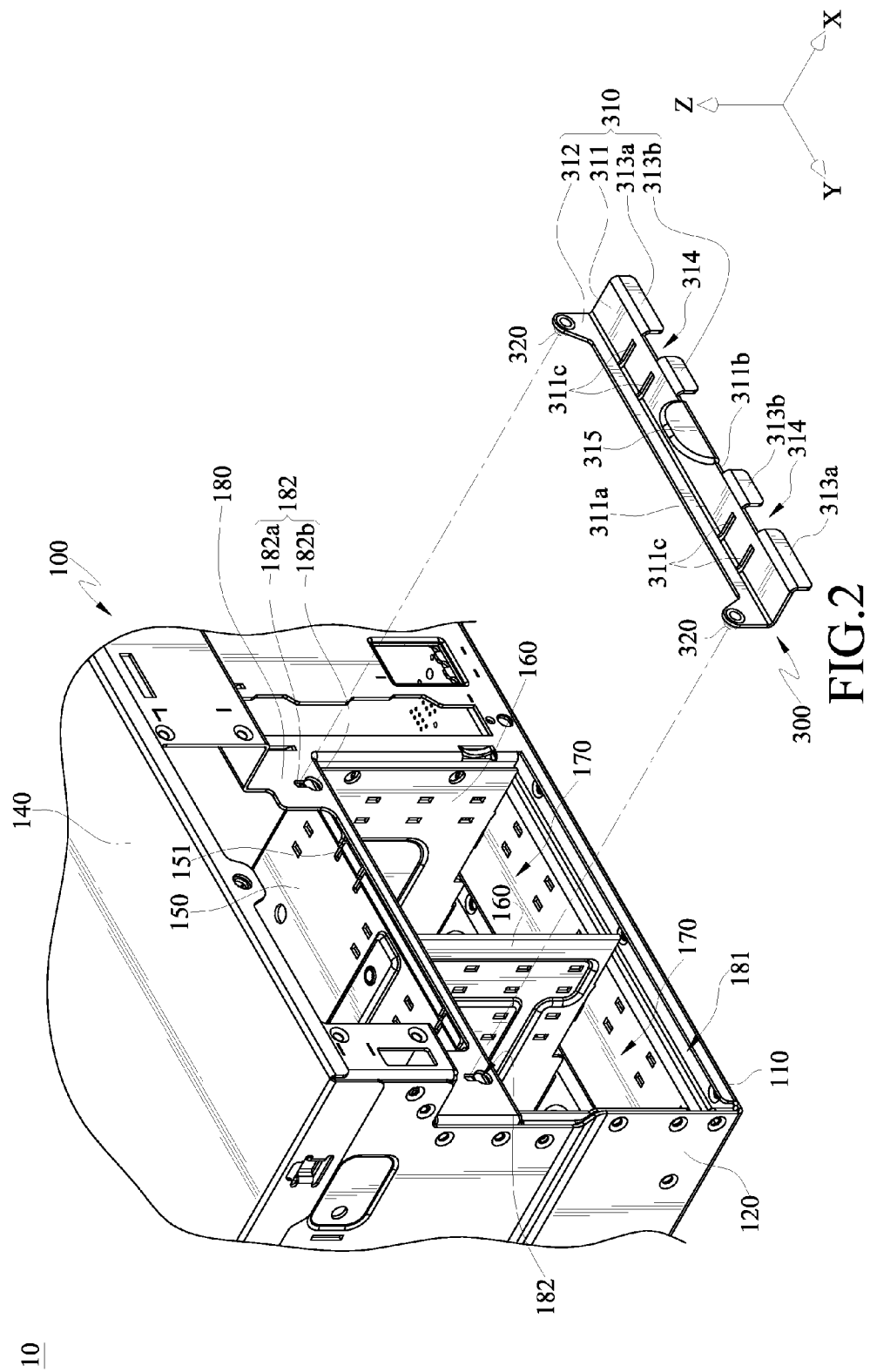
FIG. 2 is a partially exploded view of the server in FIG. 1A when a casing is separated from an assembly component.
Figure 3A:
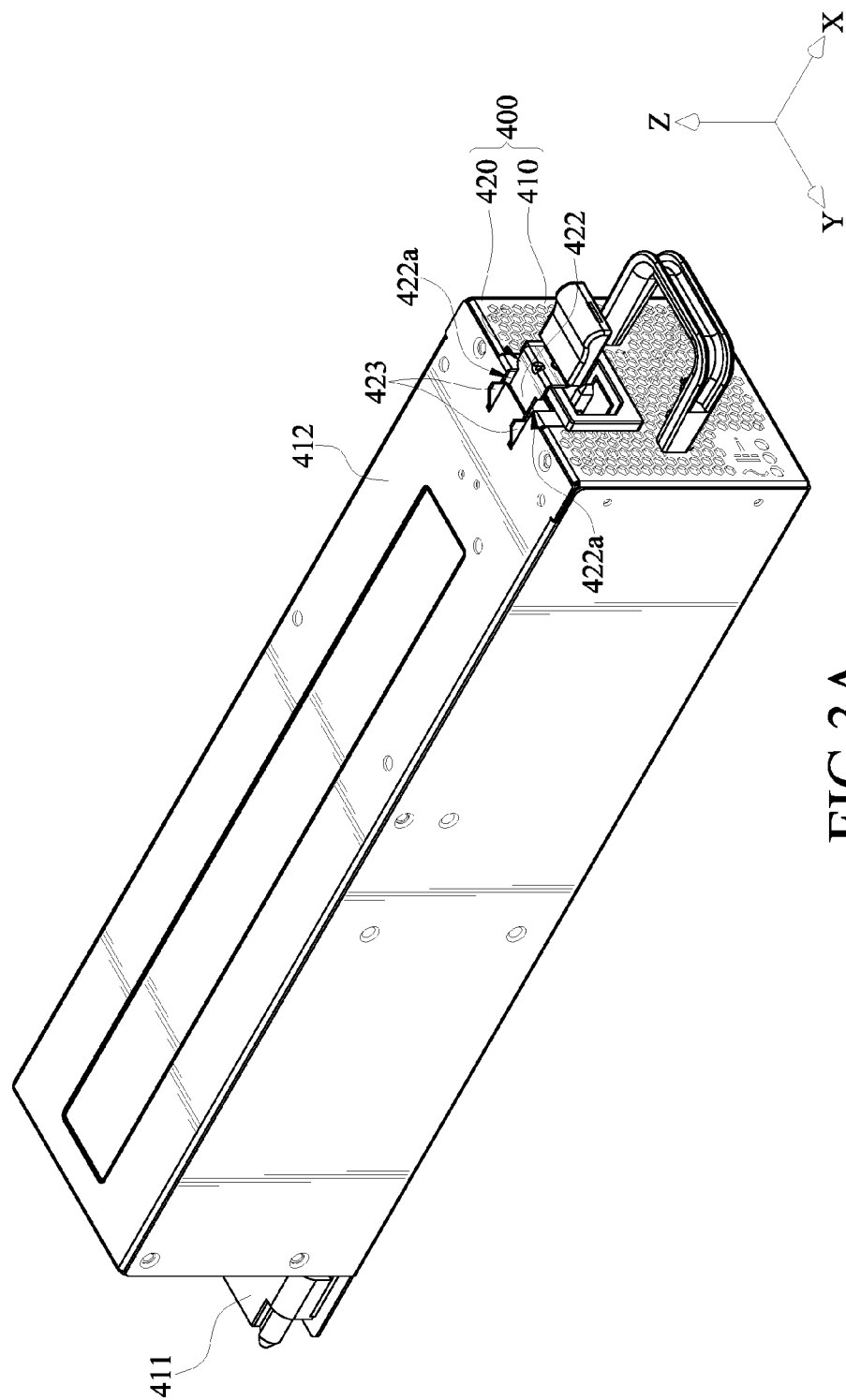
FIG. 3A is a perspective view of a power supply of the server in FIG. 1A.
Figure 3B:
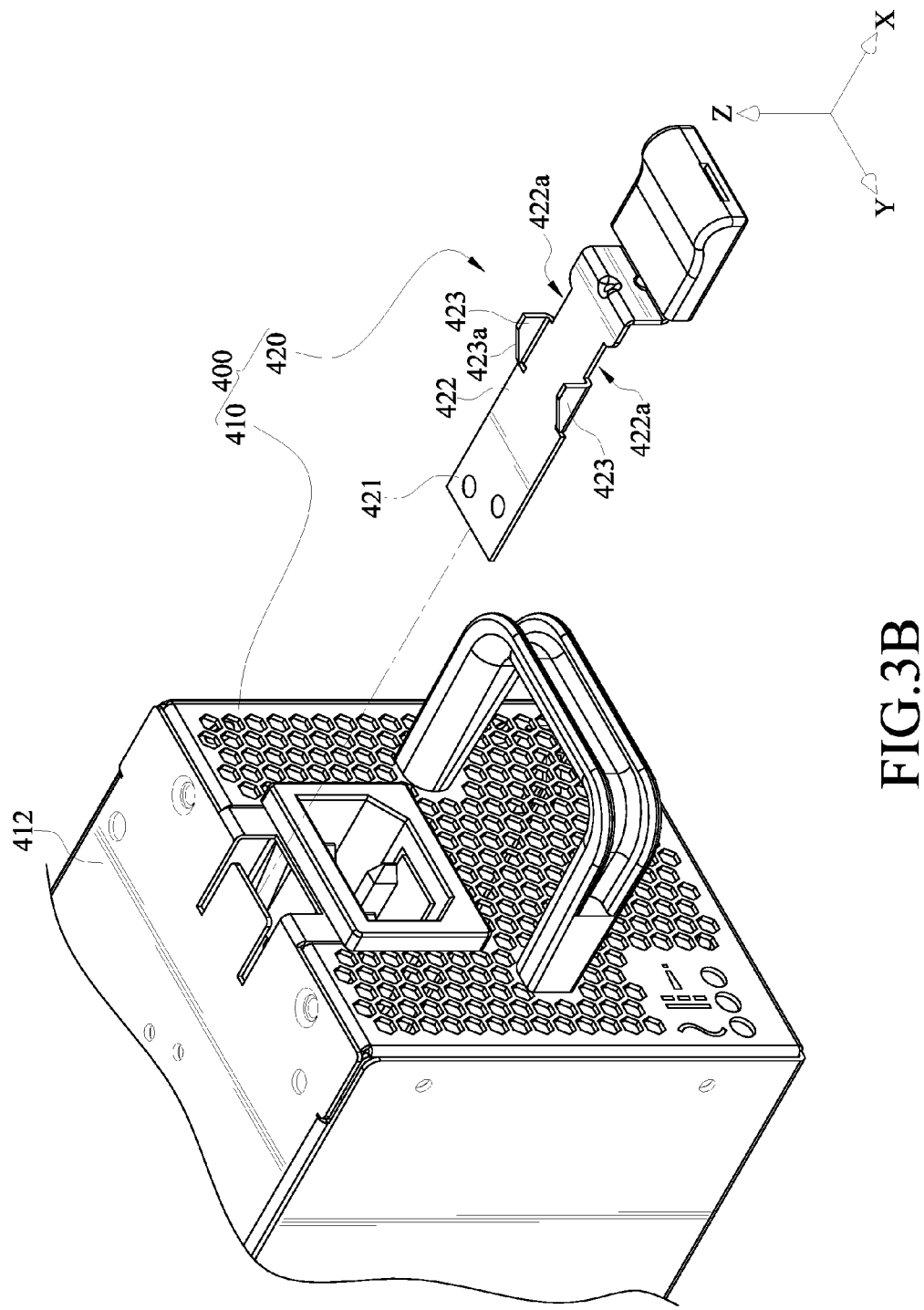
FIG. 3B is a partially exploded view of the power supply in FIG. 3A.

Please refer to FIG. 1A through FIG. 3B. FIG. 1A is a perspective view of a server according to a first embodiment of the disclosure. FIG. 1B is a cross-sectional view of the server in FIG. 1A. FIG. 2 is a partially exploded view of the server in FIG. 1A when a casing is separated from an assembly component. FIG. 3A is a perspective view of a power supply of the server in FIG. 1A. FIG. 3B is a partially exploded view of the power supply in FIG. 3A. In this embodiment, the server 10 includes a casing 100, a circuit board component 200, an assembly component 300 and two power supplies 400.

The casing 100 includes a bottom plate 110 with two sides which are opposite to each other, a first side plate 120, a second side plate 130, a top plate 140 with two sides which are opposite to each other, a horizontal partition 150, two upright partitions 160 and a rear plate 180.

The first side plate 120 and the second side plate 130 are connected to the two sides of the bottom plate 110, respectively. The top plate 140 is located upon the bottom plate 110. The first side plate 120 and the second side plate 130 are connected to the two sides of the top plate 140, respectively. The horizontal partition 150 is located between the bottom plate 110 and the top plate 140 and parallel to the bottom plate 110. One side of the horizontal partition 150 is connected to the first side plate 120. Both of the two upright partitions 160 are connected to the bottom plate 110 and the horizontal partition 150 so as to form two assembly channels 170 surrounded by the bottom plate 110, the first side plate 120, the horizontal partition 150 and the two upright partitions 160. Moreover, the horizontal partition 150 has four first fastening slots 151. Two of the four first fastening slots 151 are corresponding to one of the two assembly channels 170, and the other two of the four first fastening slots 151 are corresponding to the other assembly channel 170.

In this embodiment, the quantity of the first fastening slots 151 is four. However, in other embodiments, the quantity of the first fastening slots 151, for example, is two, and the two first fastening slots 151 are corresponding to the two assembly channels 170, respectively.

The rear plate 180 is connected to the first side plate 120, the second side plate 130 and the top plate 140, and the rear plate 180 stands on the bottom plate 110. Additionally, the rear plate 180 has two first openings 181 and two fastening holes 182. The two first openings 181 are located at an end of each assembly channel 170, respectively. Each assembly channel 170 has a second opening 190 which is located at another end of the assembly channel 170 opposite to the end where the first opening 181 is located. The two fastening holes 182 are located between the two first openings 181 and the top plate 140. Namely, the two first openings 181 are located between the two fastening holes 182 and the bottom plate 110. Each fastening hole 182 extends from the top plate 140 toward the bottom plate 110 and has a fastening section 182a and a release section 182b which are connected to each other. A width of the release section 182b is greater than a width of the fastening section 182a. In this embodiment, the release section 182b of the fastening hole 182 is closer to the first opening 181 than the fastening section 182a of the fastening hole 182. The effect of relative positions of the fastening section 182a and the release section 182b will be described hereinafter.

To describe the operation of the server 10 specifically, a first axial direction, a second axial direction and a third axial direction are defined to be orthogonal. The first axial direction is parallel to a normal direction of the rear plate 180, and the normal direction of the rear plate 180 is parallel to the X-axis. The second axial direction is parallel to a normal direction of the bottom plate 110, and the normal direction of the bottom plate 110 is parallel to the Z-axis. The third axial direction is parallel to a normal direction of the first side plate 120, and the normal direction of the first side plate 120 is parallel to the Y-axis.

The circuit board component 200 is disposed inside the casing 100 and includes a substrate 210 and two first electrical connectors 220. The substrate 210 is near the assembly channel 170 and disposed on the bottom plate 110. Pins of the two first electrical connectors 220 are welded and electrically connected to the substrate 210. The two first electrical connectors 220 are located at or near the second opening 190 of the assembly channels 170.

As shown in FIG. 1A and FIG. 2, the assembly component 300 is located out of the casing 100 and movably assembled with the casing 100 near the first openings 181. Moreover, the assembly component 300 is movable relative to the casing 100 along the second axial direction. Specifically, the assembly component 300 includes a frame 310 and two fastening blocks 320. The frame 310 includes a fastening plate 311, two assembly plates 312, two pairs of limiting plates 313a and 313b, and a grip 315. The fastening plate 311 has four second fastening slots 311c. Two of the second fastening slots 311c are regarded as a group, and two groups of second fastening slots 311c are corresponding to the two assembly channels 170, respectively. Furthermore, the fastening plate 311 has a first sideline 311a and a second sideline 311b which are opposite to each other. The two assembly plates 312 are connected to the first sideline 311a of the fastening plate 311, and the two assembly plates 312 stand on the fastening plate 311. The two pairs of limiting plates 313a and 313b are connected to the second sideline 311b of the fastening plate 311, and an extension direction of each pair of limiting plates 313a and 313b is opposite to an extension direction of each assembly plate 312. Each limiting slot 314 is formed by the limiting plates 311 and 311.

The grip 315 is connected to the second sideline 311b of the fastening plate 311 and stands on the fastening plate 311. The grip 315 is for a user to assemble the assembly component 300 with the casing 100 easily. In this embodiment, the grip 315 is perpendicular to the fastening plate 311, and an extension direction of the grip 315 is substantially the same as the extension direction of the assembly plate 312. However, in other embodiments (not shown in FIGs.), for example, the grip 315 is parallel to the fastening plate 311 and protrudes from a side of the fastening plate 311.

The two fastening blocks 320, for example, are T-shaped blocks. An end of each fastening block 320 is assembled with each assembly plate 312, and the other end of each fastening block 320 is movably assembled with each fastening hole 182. Thus, the two fastening blocks 320 are movable inside the two fastening holes 182. In detail, the two fastening blocks 320 are able to be either moved to the fastening section 182a of the two fastening sections 182 to be fastened with the rear plate 180 or moved to the two release sections 182b to be separated from the fastening hole 182 of the rear plate 180.

As shown in FIG. 1B, when the assembly component 300 is assembled with the rear plate 180, a horizontal distance D1 between the first electrical connector 220 and the second fastening slot 311c of the fastening plate 311 is greater than a horizontal distance D2 between the first electrical connector 220 and the first fastening slot 151 of the horizontal partition 150.

Each power supply 400 comprises a main body 410 and a fastening unit 420. The main body 410 has a second electrical connector 411 and a top surface 412 which is away from the bottom plate 110. The second electrical connector 411 of the main body 410 is combined and electrically connected with the first electrical connector 220 of the circuit board component 200.

Each fastening unit 420 includes a combined part 421, a flexible part 422 with two sides which are opposite to each other, and two protrusions 423. The combined part 421, for example, is assembled with the top surface 412 of the main body 410 by rivets. The flexible part 422 is connected to the combined part 421 and has two recesses 422a. The two recesses 422a are located at the two sides of the flexible part 422, respectively. The protrusions 423 are connected to the two flexible parts 422 and located between the recesses 422a and the combined part 421, respectively. Moreover, the protrusions 423 protrude from the top surface 412 of the main body 410 and each of the protrusions 423 has a guiding inclination 423a. Each guiding inclination 423a is located at a side of the protrusion 423 where is close to the second electrical connector 411. When the power supply 400 slides into the assembly channel 170, the power supply 400 is guided by the guiding inclinations 423a of the protrusions 423, for preventing from being interfered by the fastening plate 311 and the horizontal partition 150. In other words, when the power supply 400 slides into the assembly channel 170, a user does not need to press the fastening unit 420 manually for fastening the protrusions 423 with the first fastening slots 151 or the second fastening slots 311c. The protrusions 423 are fastened with the first fastening slots 151 or the second fastening slots 311c automatically by being guided by the guiding inclinations 423a of the protrusions 423. Furthermore, the main body 410 is movably assembled with the assembly channel 170 of the casing 100 from the first opening 181 toward the second opening 190. Accordingly, the fastening unit 420 is fastened with either the first fastening slots 151 or the second fastening slots 311c.

Namely, the second electrical connector 411 is combined with or separated from the first electrical connector 220 selectively.

In terms of the design of the first fastening slot 151 and the second fastening slot 311c, as shown in FIG. 1B, when the power supply 400 slides in to the assembly channel 170, both the first fastening slot 151 and the second fastening slot 311c are located at the same motion path. The motion path is defined as a path along the first axial direction. A distance difference between the horizontal distance D1 and the horizontal distance D2 at the same motion path is greater than a combined depth of the first electrical connector 220 and the second electrical connector 411. The combined path is defined as a distance of the first electrical connector 220 into which the second electrical connector 411 inserts. Accordingly, when the protrusions 423 of the fastening unit 420 are fastened with the second fastening slot 311c of the fastening plate 311, the second electrical connector 411 of the power supply 400 is separated from the first electrical connector 220 of the circuit board component 200. Additionally, when the protrusions 423 of the fastening unit 420 are fastened with the second fastening slot 311c or the first fastening slot 151, the protrusions 423 are blocked by the horizontal partition 150 or the fastening plate 311 so as not to allow the power supply 400 to slide outward from the assembly channel 170 along the first axial direction.

Furthermore, when the assembly component 300 is assembled with the rear plate 180 of the casing 100 and the protrusions 423 of the fastening unit 420 are fastened with the second fastening slots 311c, the limiting plates 313a and 313b are located at the recesses 422a, and the flexible part 422 is maintained inside the limiting slot 314. Accordingly, the flexible part 422 of the power supply 400 is not able to reversely slide inward the assembly channel 170 by each limiting plate 313a and each limiting plate 313b.

In this embodiment, both the quantities of the assembly channels 170 of the casing 100 and the power supplies 400 are two. One of the power supplies 400 is for supplying power to the server 10, and the other power supply 400 is considered as a spare power supply. However, in other embodiments, for example, both the quantities of the assembly channels 170 of the casing 100 and the power supplies 400 are four. The two power supplies 400 are for supplying power to the server 10, and the other power supplies 400 are considered as spare power supplies.

Figure 4A:
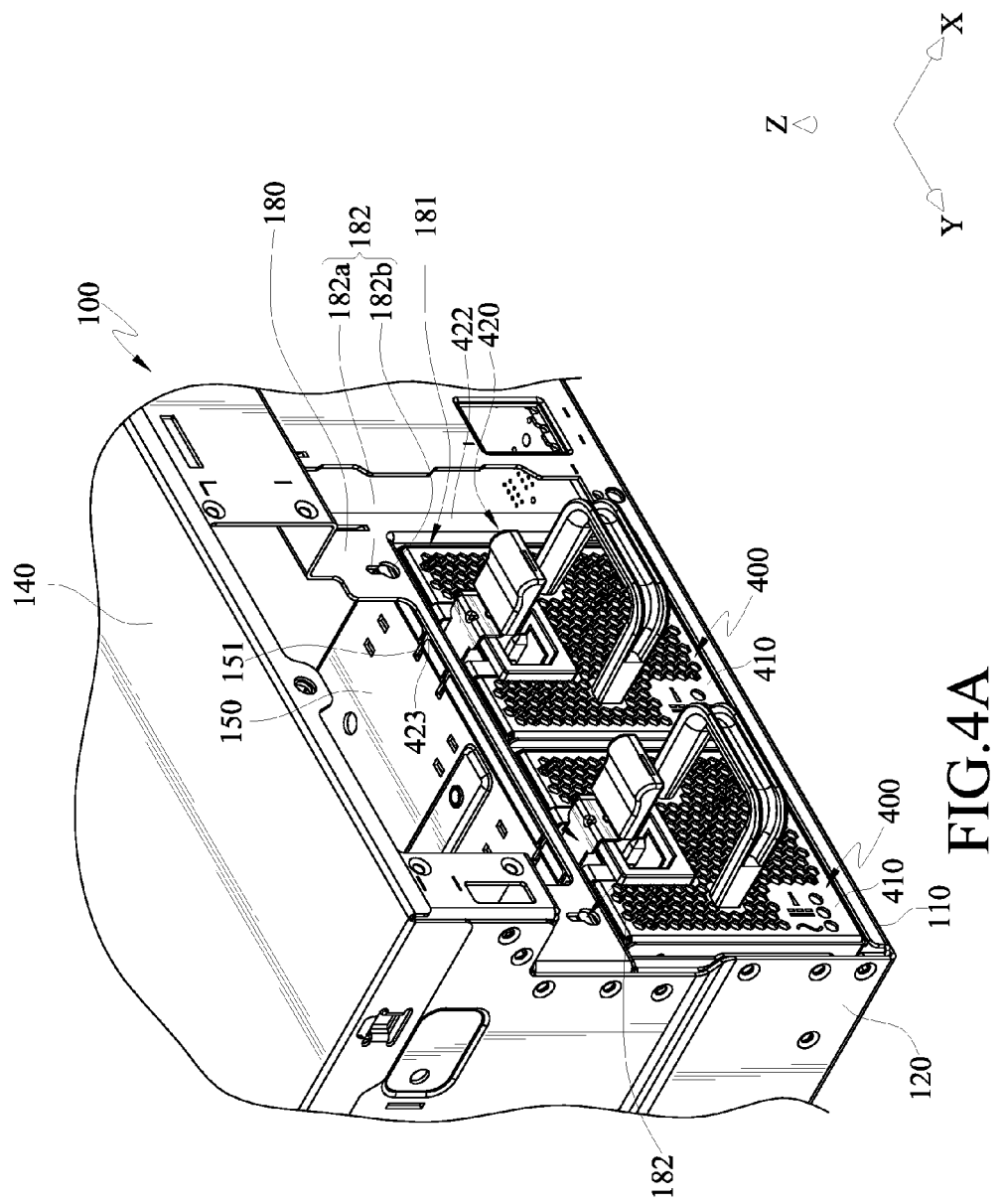
FIG. 4A through FIG. 12 are partially perspective views of the server in FIG. 1A during operation.
Figure 4B:
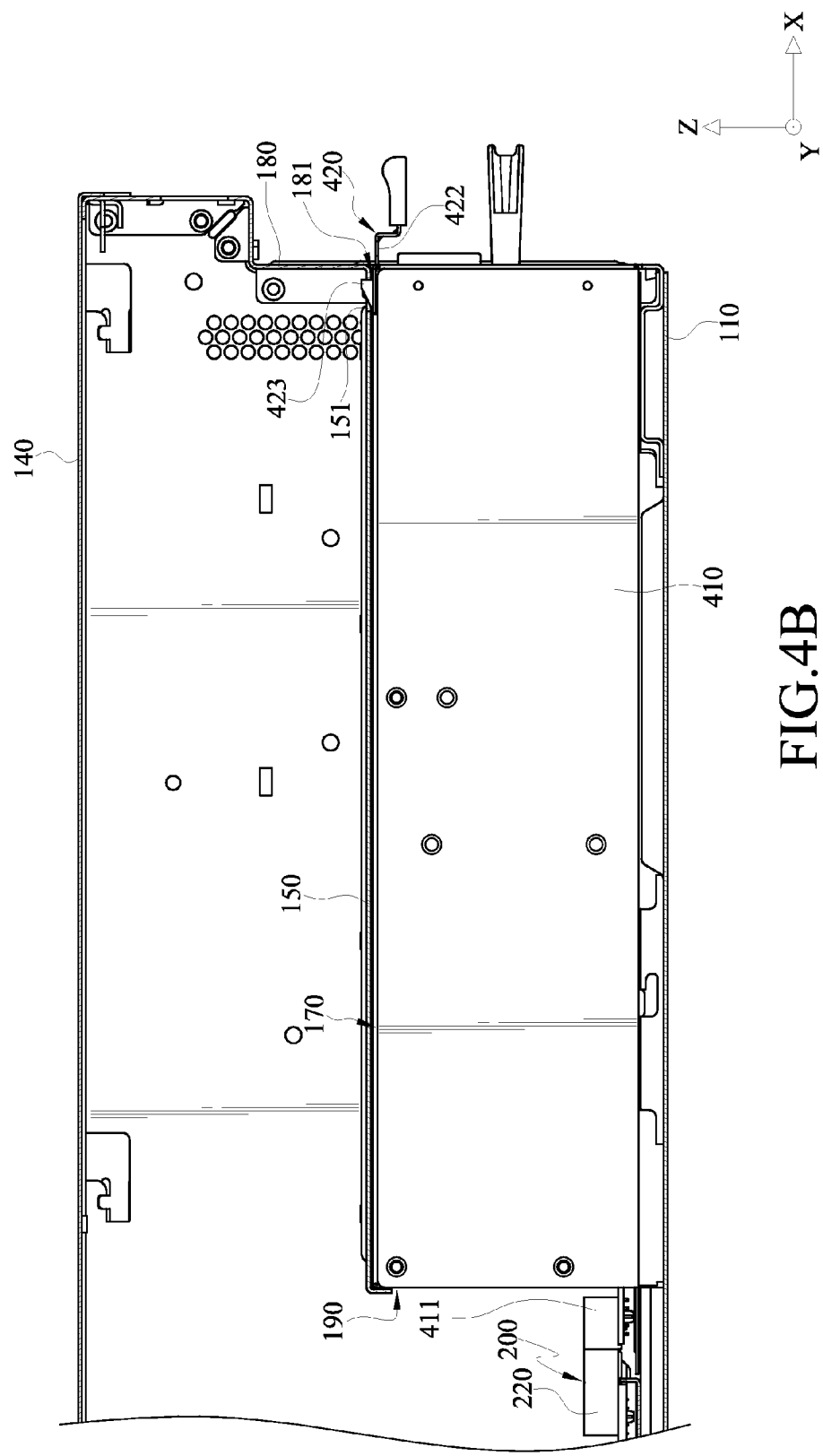

Please refer to FIG. 4A through FIG. 12 which are partially perspective views of the server in FIG. 1A during operation. As shown in FIG. 4A and FIG. 4B, when the two power supplies 400 are assembled with the two assembly channels 170, both the four protrusions 423 of the fastening units 420 are fastened with the two first fastening slots 151 of the horizontal partition 150, and the two first electrical connectors 220 of the two power supplies 400 are electrically connected to the two second electrical connectors 411 of the circuit board component 200. At this time, the server 10 is in a usage state for uploading, downloading or testing the data.

Then, when the server 10 is transported, the first electrical connector 220 of the circuit board component 200 and the second electrical connector 411 of the power supply 400 are separated from each other, electrical connection interfaces are prevented from damage due to accidental collisions. The electrical connection interface, for example, is a connecting line between the first electrical connector 220 and the substrate 210, a connecting line between the second electrical connector 411 and the substrate 210, or a connecting line between the second electrical connector 411 and the main body 410.

Figure 5:
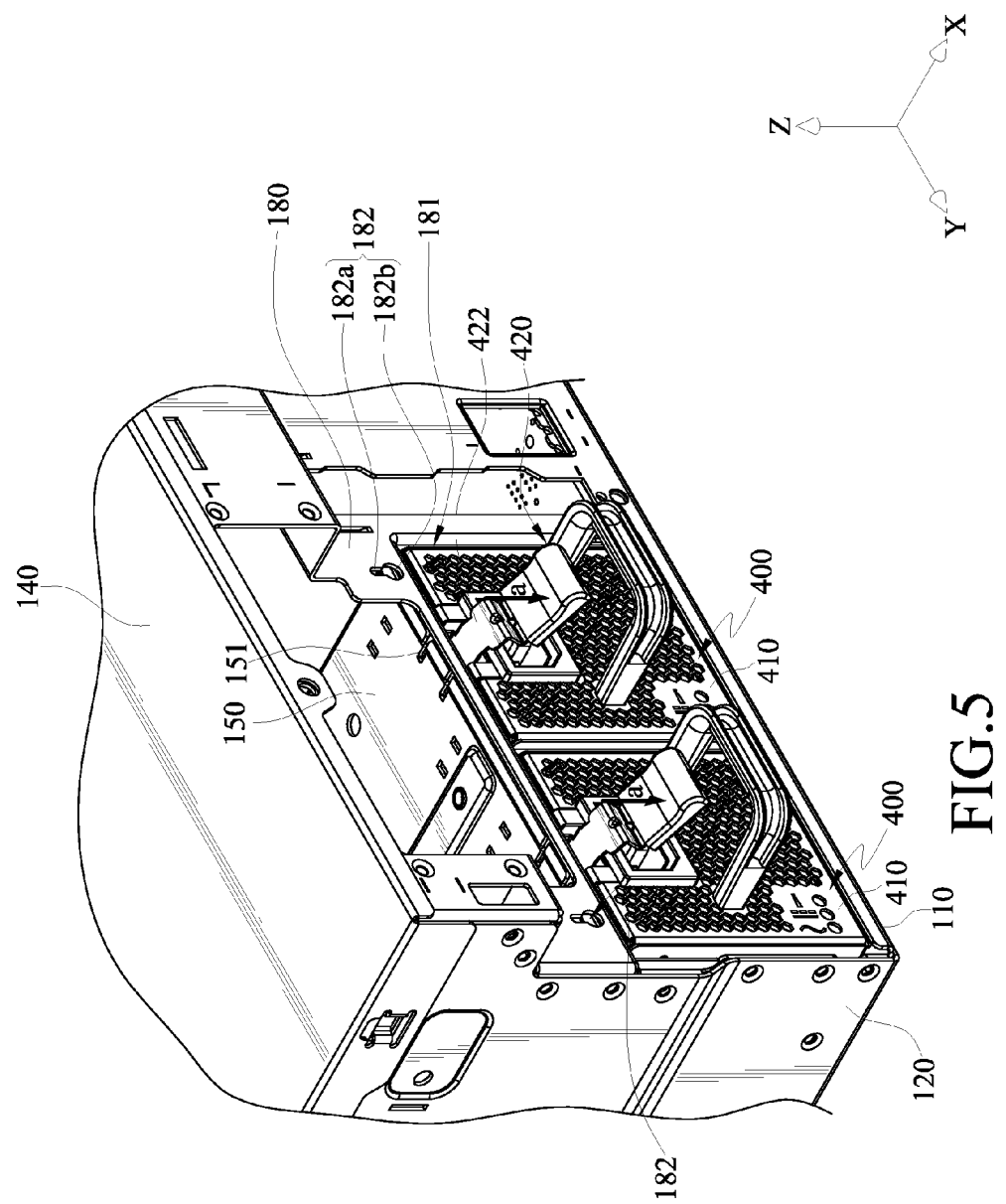

How to separate the first electrical connector 220 of the circuit board component 200 from the second electrical connector 411 of the power supply 400 is described as follows. As shown in FIG. 5, first, the fastening unit 420 are pressed downward along a direction indicated by an arrow a, for giving a space atop the two fastening units 420 to assemble the assembly component 300 with the rear plate 180. In this embodiment, the direction indicated by the arrow a is parallel to the second axial direction.

Figure 6:
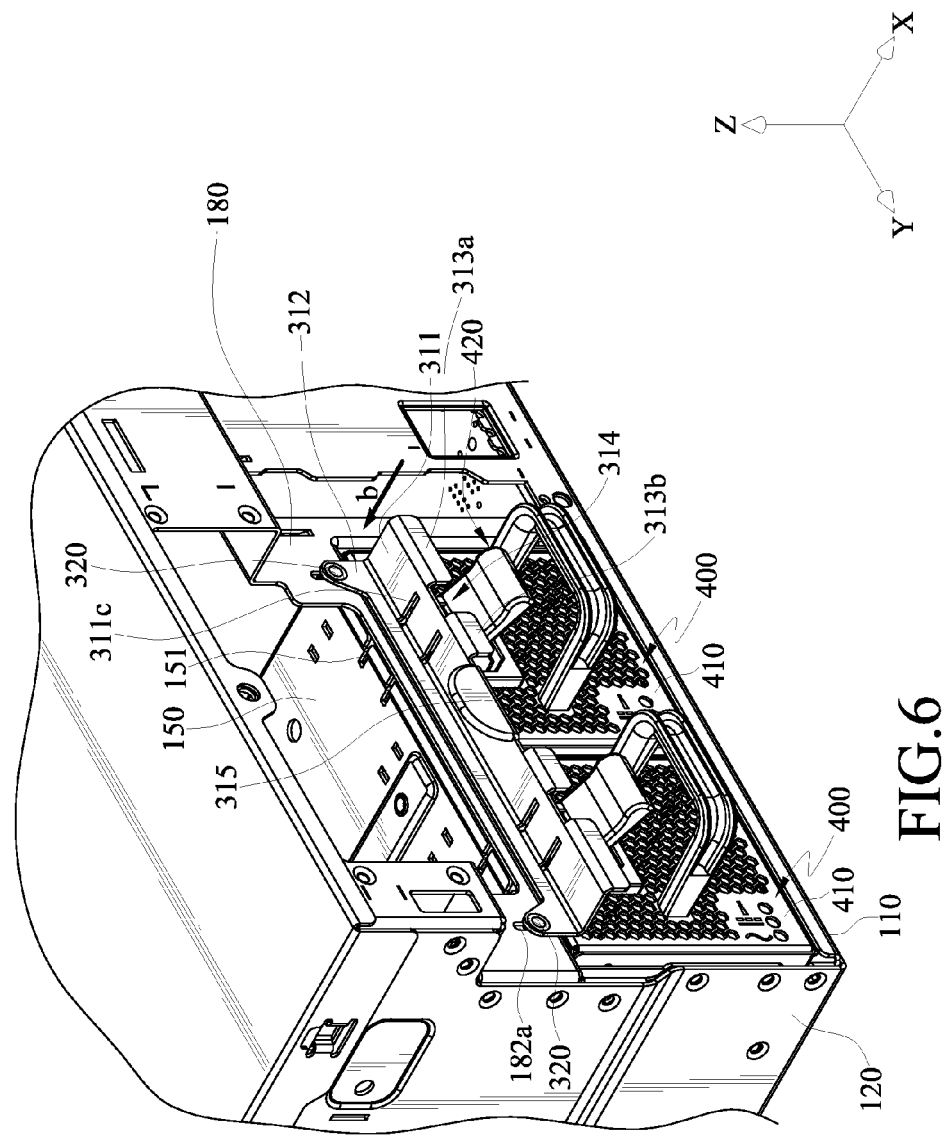

Then, as shown in FIG. 6, the fastening block 320 of the assembly component 300 is fastened with the release section 182b of the fastening hole 182 along a direction indicated by an arrow b. The direction indicated by the arrow b is parallel to the first axial direction.

Figure 7:
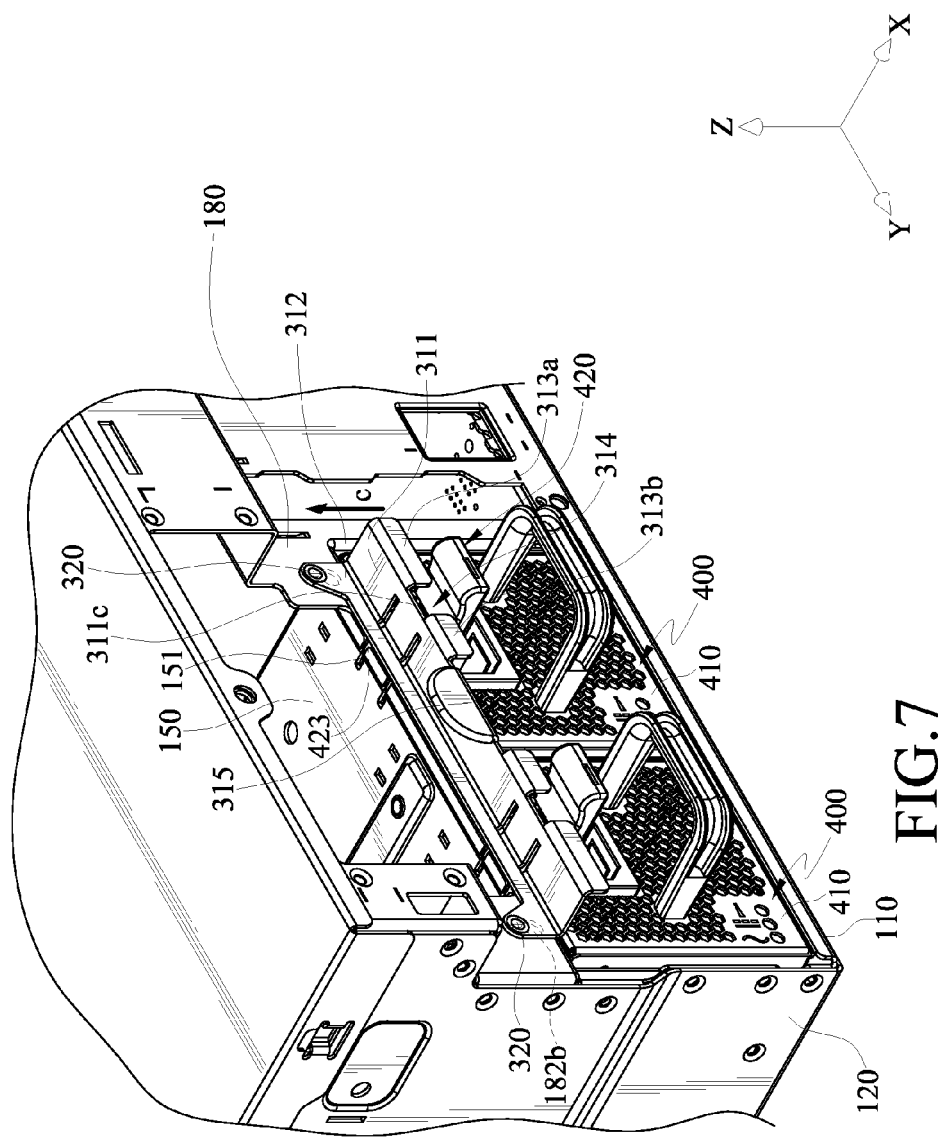

Then, as shown in FIG. 7, when the two fastening units 420 are not pressed by a user, the two fastening units 420 are restored along a direction indicated by an arrow c due to a restorative elastic force of the flexible parts 422 of the two fastening units 420. The direction indicated by the arrow c is parallel to the second axial direction. At the same time, the fastening block 320 of the assembly component 300 (as shown in FIG. 1A) is moved to the fastening section 182a of the fastening hole 182. Therefore, the assembly component 300 is assembled with the rear plate 180.

Figure 8:
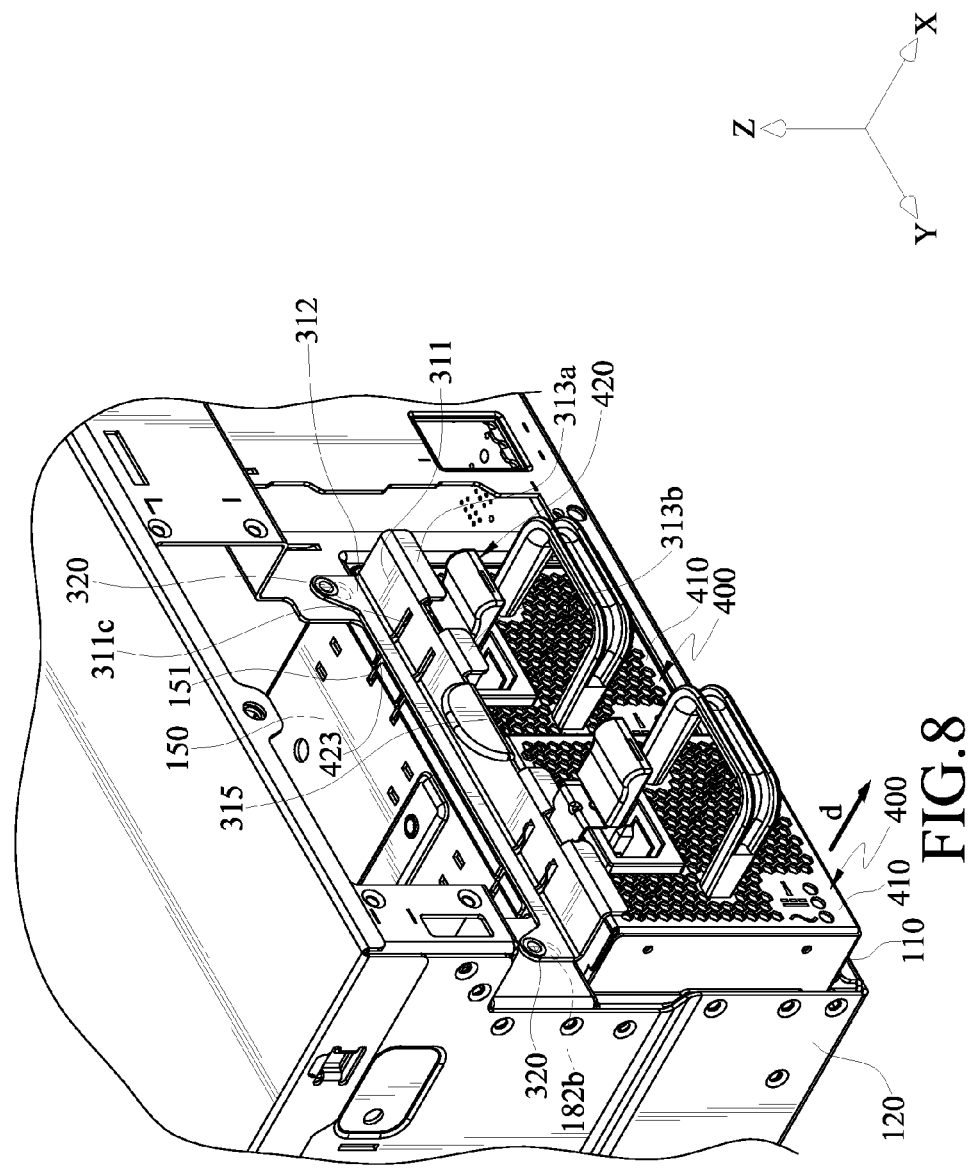
Figure 9:
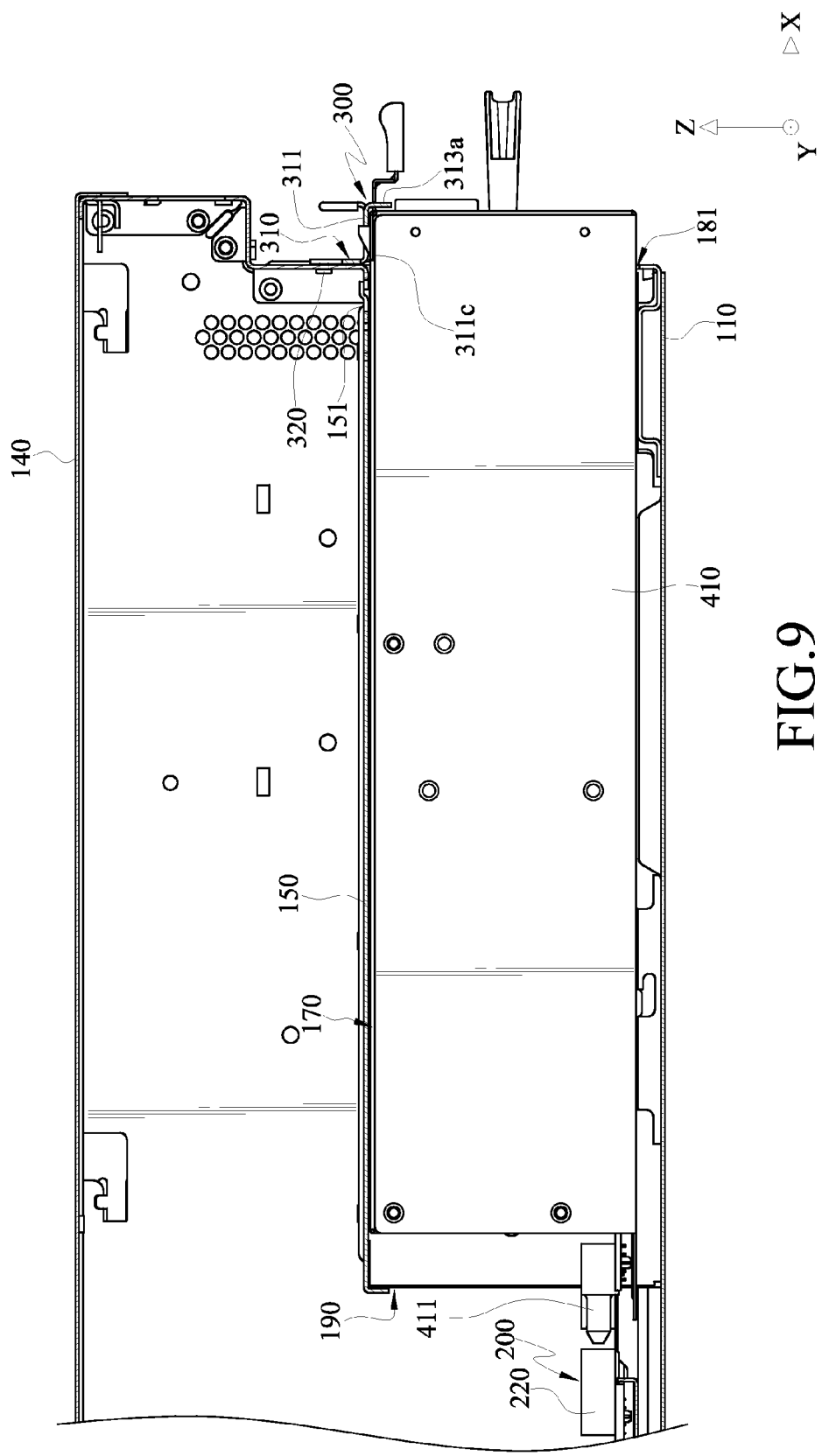

Afterwards, as shown in FIG. 8, one power supply 400 is drawn outward along a direction indicated by an arrow d (parallel to the first axial direction), and a part of the power supply 400 protrudes from the first opening 181. At this time, the two protrusions 423 are fastened with the two second fastening slots 311c, and the two recesses 422a are fastened with the two limiting plates 313a and 313b, correspondingly. Thus, the second electrical connector 411 of the power supply 400 is separated from the first electrical connector 220 of the circuit board component 200 (as shown in FIG. 9), and the movement of the power supply 400 is limited in the first axial direction by the two protrusions 423 and two limiting plates 311a and 311b, for preventing the second electrical connector 411 (as shown in FIG. 9) of the power supply 400 from being combined with the first electrical connector 220 of the circuit board component 200. Moreover, to draw out the power supply 400, first, the fastening unit 420 is pressed downward, such that the protrusion 423 is separated from the first fastening slot 151. Then, the power supply 400 is drawn out along the direction indicated by the arrow d.

As shown in FIG. 9. First, the movement of the power supply 400 is limited in the first axial direction by the second fastening slot 311c and the limiting slot 314 of the assembly component 300. Hence, when the fastening unit 420 of the power supply 400 is fastened with the second fastening slot 311c, the fastening plate 311 of the assembly component 300 is supported by the main body 410 of the power supply 400. Second, due to the design of the positions of the release section 182b and the fastening section 182a of the fastening hole 182, when the fastening plate 311 of the assembly component 300 is supported by the main body 410 of the power supply 400, the fastening block 320 of the assembly component 300 is fastened with the fastening section 182a of the fastening hole 182. Thus, the assembly component 300 and the power supply 400 are fixed to each other steadily. Namely, when the assembly component 300 is supported by the power supply 400, the assembly component 300 is fixed to the rear plate 180 (as shown in FIG. 2). When the assembly component 300 is fixed to the rear plate 180, the power supply 400 is fixed to the assembly component 300 accordingly. Therefore, unless the fastening unit 420 (as shown in FIG. 8) is pressed manually to separate the protrusion 423 from the second fastening slot 311c, the power supply 400 is maintained at an appropriate position during transport. The appropriate position means that the fastening unit 420 of the power supply 400 is fastened with the second fastening slot 311c of the assembly component 300. Accordingly, the electrical connection interface between the power supply 400 and the circuit board component 200 is prevented from damage due to collision during transport. Accordingly, the transport quality of the server 10 is improved.

Figure 10:
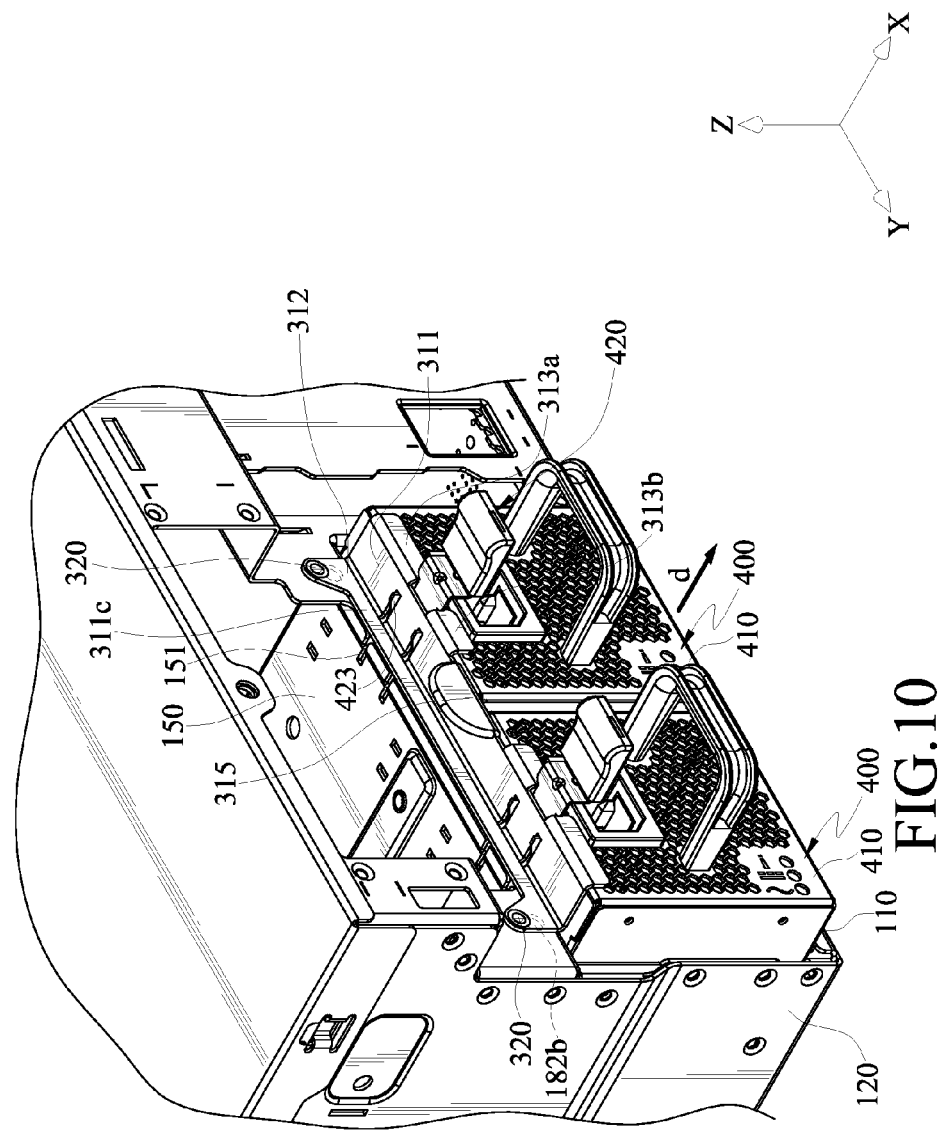

As shown in FIG. 10, the steps shown in FIG. 8 are repeated. The other power supply 400 is drawn outward along the direction indicated by the arrow d (which is parallel with the first axial direction), and the two protrusions 423 (as shown in FIG. 8) are fastened with the two second fastening slots 311c, and the two recesses 422a (as shown in FIG. 3A) are fastened with the two limiting plates 313a and 313b, correspondingly. Accordingly, the electrical connection interfaces between the circuit board component 200 and the power supply 400, such as the connecting line between the first electrical connector 220 (as shown in FIG. 1B) and the substrate 210 (as shown in FIG. 1B), the connecting line between the second electrical connector 411 (as shown in FIG. 9) and the substrate 210, and the connecting line between the second electrical connector 411 (as shown in FIG. 9) and the main body 410, are prevented from being damaged due to collision during transport.

Figure 11:
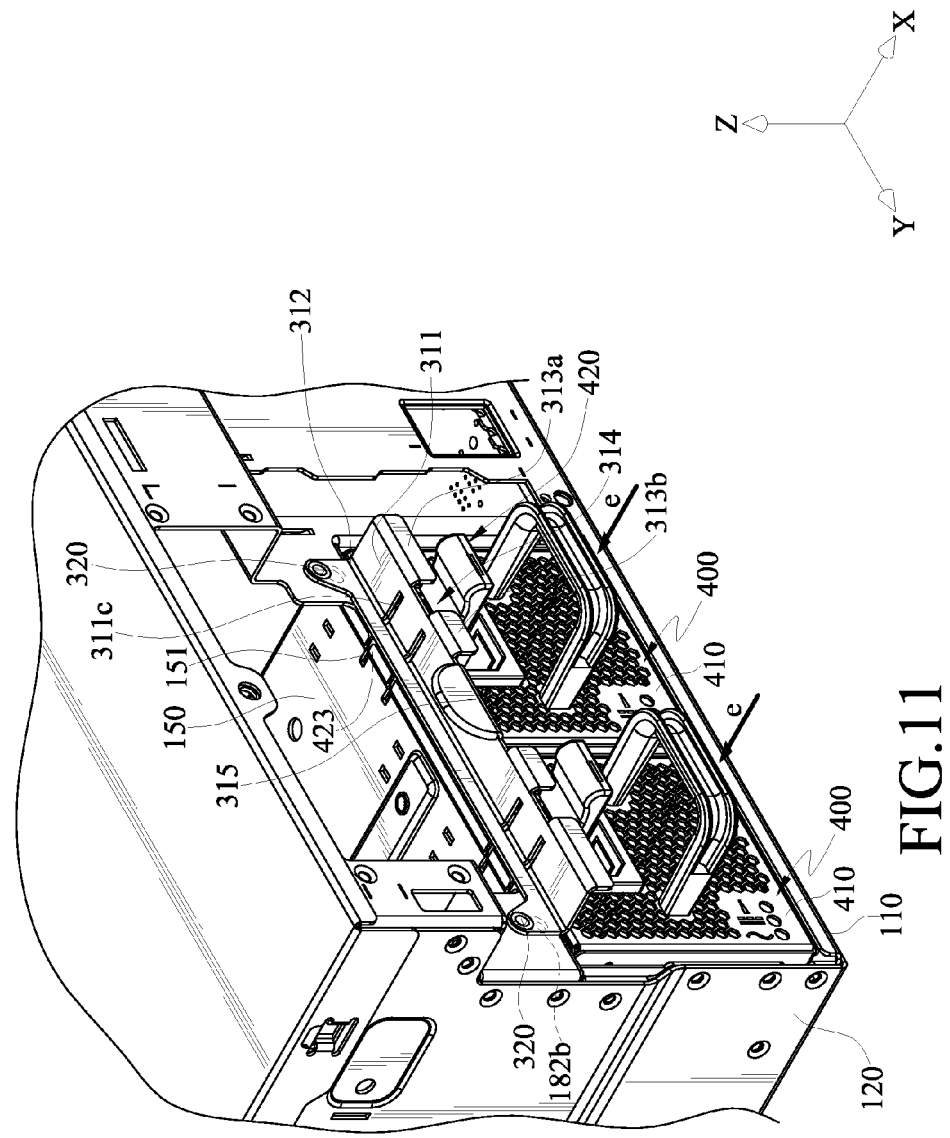

When the server 10 is delivered to a user and is ready to operate, the second electrical connector 411 of the power supply 400 is combined with the first electrical connector 220 again. The steps are shown in FIG. 11, first, the two power supplies 400 is pushed inward inside the assembly channels 170 (as shown in FIG. 1B) along a direction indicated by an arrow e, such that the two fastening units 420 (as shown in FIG. 8) of the two power supplies 400 are fastened with the two first fastening slots 151 of the horizontal partition 150 again. Thus, the two second electrical connectors 411 (as shown in FIG. 9) of the two power supplies 400 are electrically connected to the two first electrical connectors 220 (as shown in FIG. 1B).

Figure 12:
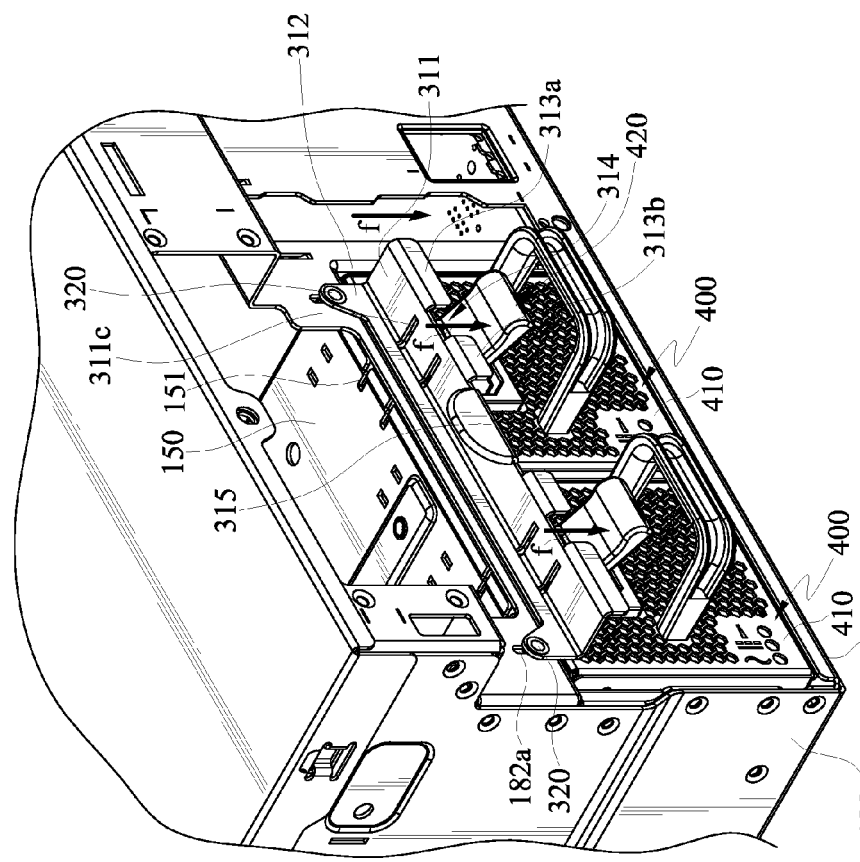

Then, as shown in FIG. 12, the fastening units 420 of the two power supplies 400 are pressed downward along a direction indicated by an arrow f. At this time, the assembly component 300 is moved downward without the support of the power supply 400. Thus, the fastening block 320 of the assembly component 300 is separated from the release section 182b of the fastening hole 182 (as shown in FIG. 2), such that the assembly component 300 is separated from rear plate 180 (as shown in FIG. 2).

Figure 13:
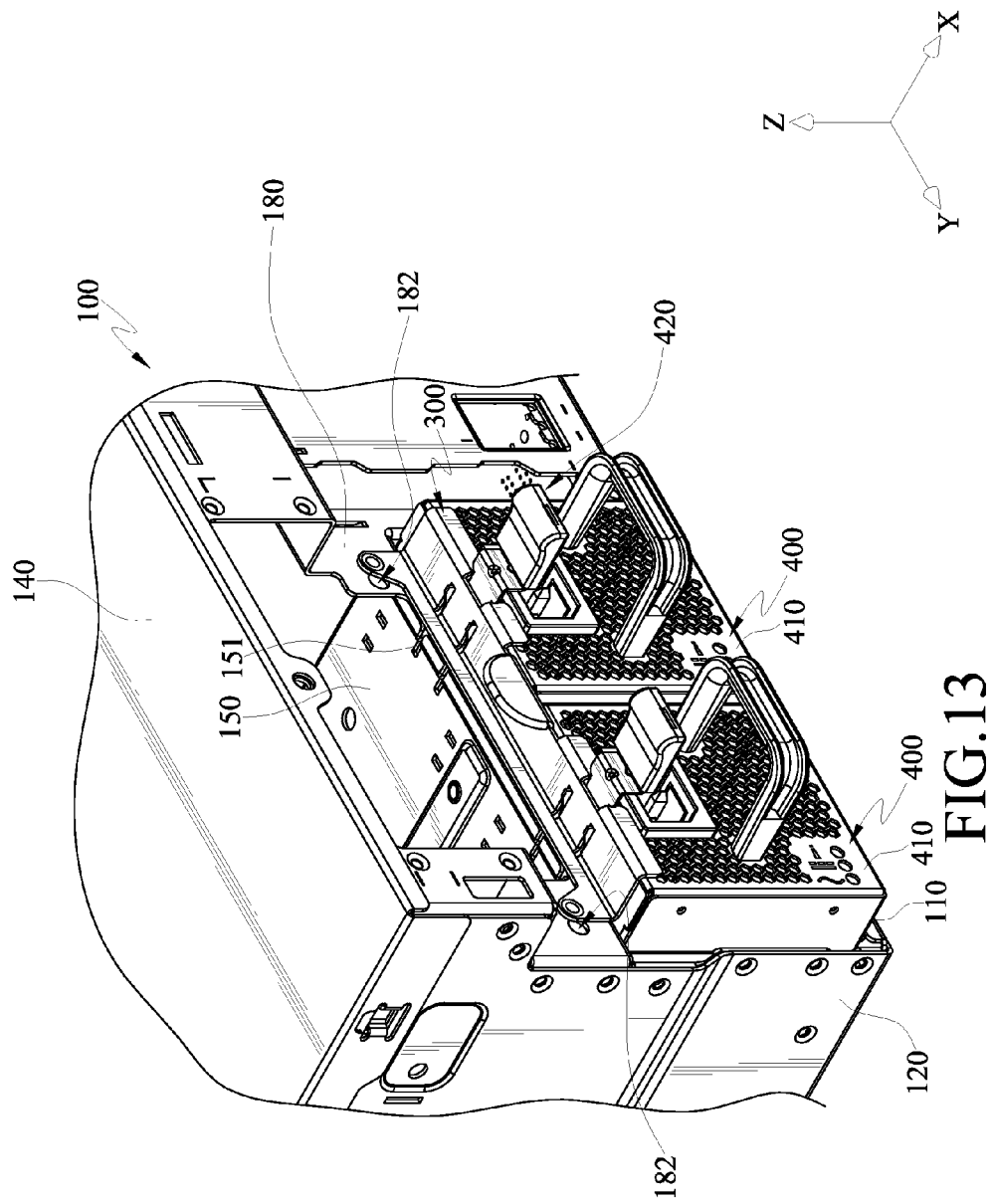
FIG. 13 is a perspective view of a server according to a second embodiment of the disclosure.
Figure 14:
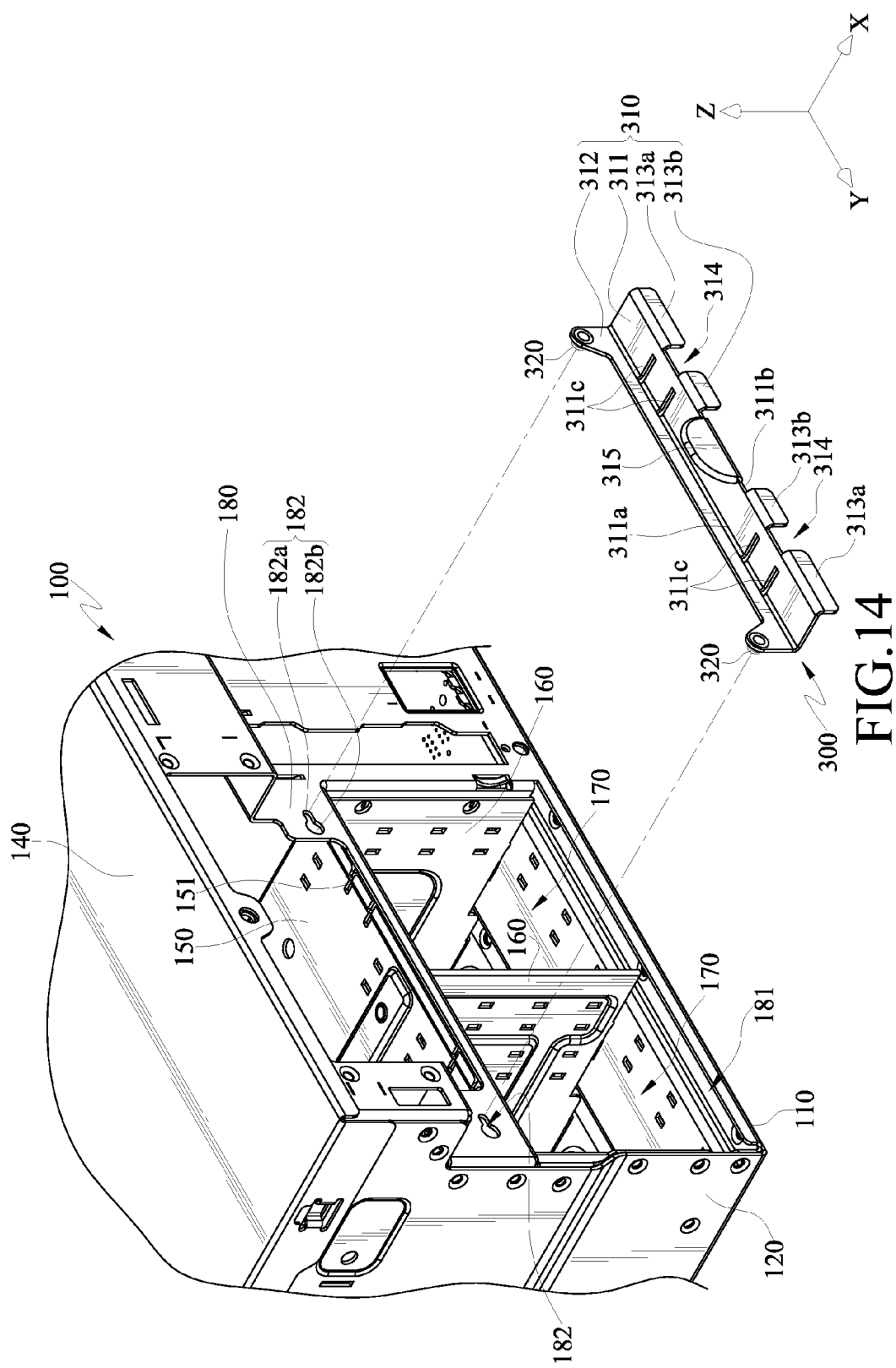
FIG. 14 is a partially exploded view of the server in FIG. 13 when a casing is separated from an assembly component.

In this embodiment, the fastening section 182a and the release section 182b of the fastening hole 182 extend along the second axial direction (parallel to the Z-axis). However, in other embodiments, for example, the fastening section 182a and the release section 182b of the fastening hole 182 extend along the third axial direction (parallel to the Y-axis). Specifically, please refer to FIG. 13 and FIG. 14. FIG. 13 is a perspective view of a server according to a second embodiment of the disclosure. FIG. 14 is a partially exploded view of the server in FIG. 13 when a casing is separated from an assembly component. In this embodiment, the fastening hole 182 of the rear plate 180 extends along the third axial direction and has a fastening section 182a and a release section 182b which are connected to each other. The release section 182b is closer to the first side plate 120 than the fastening section 182a. In this embodiment, the assembly component 300 is movably assembled with the rear plate 180 of the casing 100 along the third axial direction. However, since the assembly component 300 is movable along the third axial direction in this embodiment, the power supply 400 and the assembly component 300 cannot be fixed to each other. In other words, this embodiment is different from the configurations of the power supply 400 and the assembly component 300 in the first embodiment shown in FIG. 1.

According to the server of the disclosure, the protrusion of the power supply is able to be fastened with the first fastening slot or the second fastening slot selectively, allowing the power supply to be maintained at a usage position (i.e., the protrusion of the power supply is fastened with the first fastening slot, and the second electrical connector is combined with the first electrical connector and maintained at the first position) or a transport position (i.e., the protrusion of the power supply is fastened with the second fastening slot, and the second electrical connector is separated from the first electrical connector at a second position, selectively). Thus, before the server is transported, the power supply is maintained at the transport position, for preventing the electrical connection interfaces (such as the connecting line between the first electrical connector and the substrate, the connecting line between the second electrical connector and the substrate, and the connecting line between the second electrical connector and the main body) from damage due to collisions during transport.

Furthermore, in some embodiments, since the assembly component and the power supply are fixed to each other, the power supply is maintained at the transport position steadily, which reduces the risk of damage of the electrical connection interface between the circuit board component and the power supply.

The disclosure will become more fully understood from the said embodiment for illustration only and thus does not limit the disclosure. Any modifications within the spirit and category of the disclosure fall in the scope of the disclosure.

What is claimed is:

1. A server, comprising:
a casing having at least one assembly channel and at least one first fastening slot, the assembly channel being for providing a motion path, and the first fastening slot being located at one side of the assembly channel;
a circuit board component disposed inside the casing and comprising a substrate and at least one first electrical connector, the first electrical connector being fixed and electrically connected to the substrate, and located at the motion path;
an assembly component located out of the casing and detachably assembled with the casing, the assembly component having a second fastening slot located within the motion path where the first fastening slot is located, a distance along the motion path between the first electrical connector and the second fastening slot being greater than a distance along the motion path between the first electrical connector and the first fastening slot; and
a power supply comprising a main body and at least one fastening unit connected to the main body, the main body comprising a second electrical connector for being combined with the first electrical connector, the main body being for movably assembled with the assembly channel of the casing, such that the fastening unit is selectively assembled with the first fastening slot or the second fastening slot, when the fastening unit is fastened with the first fastening slot, the second electrical connector is combined with the first electrical connector and maintained at a first position, and when the fastening unit is fastened with the second fastening slot, the second electrical connector is separated from the first electrical connector and maintained at a second position, wherein a first axial direction and a second axial direction are defined to be orthogonal, the motion path is defined to be along the first axial direction, and the assembly component is movably assembled with the casing along the second axial direction.

2. The server according to claim 1, wherein the assembly channel has a first opening and a second opening which are located at the motion path and opposite to each other, the power supply is assembled with the assembly channel of the casing from the second opening toward the first opening along the motion path, and the first electrical connector of the circuit board component is located at or neighboring to the second opening.

3. The server according to claim 2, wherein the casing comprises a bottom plate, a first side plate, a second side plate, a horizontal partition, at least one upright partition and a rear plate, the first side plate and the second side plate are opposite to each other and connected to two sides of the bottom plate respectively, the horizontal partition is connected to the first side plate, the upright partition is connected to the bottom plate and the horizontal partition, and the assembly channel is formed and surrounded by the bottom plate, the first side plate, the horizontal partition and the upright partition, the first fastening slot is located at a side of the horizontal partition which is adjacent to first opening, the rear plate is connected to the first side plate and the second side plate, the first opening is formed on the rear plate, the first axial direction is parallel to a normal direction of the rear plate, and the second axial direction is parallel to a normal direction of the bottom plate.

4. The server according to claim 3, wherein all quantities of the upright partitions, the power supplies and the assembly channels are two, both the two upright partitions are connected to the bottom plate and the horizontal partition, such that the two assembly channels are formed and surrounded by the bottom plate, the first side plate, the horizontal partition and the two upright partitions, respectively, and the two power supplies are assembled with the two assembly channels of the casing, respectively.

5. The server according to claim 3, wherein the rear plate has a fastening hole, the first opening is located between the fastening hole and the bottom plate, the fastening hole extends along the second axial direction, and the fastening hole has a fastening section and a release section which are connected to each other, the release section is closer to the first opening than the fastening section, the assembly component comprises a frame and at least one fastening block, the frame comprises a fastening plate and an assembly plate, the second fastening slot is located on the fastening plate, the assembly plate stands on the fastening plate, the fastening block is assembled with the assembly plate and movably assembled with the fastening hole, such that the fastening block is moved to a fastening position and fastened with the fastening hole of the rear plate, or is moved to a release position and separated from the fastening hole, selectively.

6. The server according to claim 5, wherein when the second electrical connector of the power supply is moved to the first position inside the assembly channel, the fastening unit is fastened with the first fastening slot and the fastening block is located at the release section, and when the second electrical connector of the power supply is moved to the second position inside the assembly channel, a part of the power supply protrudes from the first opening, the fastening unit is fastened with the second fastening slot, the fastening block is moved to the fastening section, and the assembly component is supported by the main body of the power supply such that the fastening block is maintained at the fastening position.

7. The server according to claim 6, wherein the frame further comprises a pair of limiting plates, the pair of limiting plates stand on another side of the fastening plate, the pair of limiting plates extends along a direction which is opposite to the a direction along which the assembly plate extends, the pair of limiting plates is separated from each other to form a limiting slot, the main body of the power supply has a top surface which is away from the bottom plate, the fastening unit comprises a combined part, a flexible part and a protrusion, the combined part is combined with the top surface of the main body, the flexible part is connected to the combined part, the flexible part has two sides which are opposite to each other and two recesses, the two recesses are located at two sides of the flexible part respectively, the pair of limiting plates are corresponding to the recesses, the protrusion is connected to the flexible part and located between the recess and the combined part, and the protrusion protrudes from the top surface of the main body.

8. The server according to claim 7, wherein the protrusion has a guiding inclination, and the guiding inclination is located at a side of the protrusion which is close to the second electrical connector.

9. The server according to claim 5, wherein the frame further comprises a grip with two sides which are opposite to each other, the grip and the assembly plate stand on the two sides of the fastening plate respectively, and the grip extends along a direction which is the same as the direction along which the assembly plate extends.

10. The server according to claim 3, wherein a third axial direction is defined to be parallel to a normal direction of the first side plate, the rear plate has a fastening hole, the first opening is located between the fastening hole and the bottom plate, the fastening hole extends along the third axial direction, and the fastening hole has a fastening section and a release section which are connected to each other, the release section is closer to the first side plate than the fastening section, the assembly component comprises a frame and at least one fastening block, the frame comprises a fastening plate and an assembly plate, the second fastening slot is located on the fastening plate, the assembly plate stands on the fastening plate, the fastening block is assembled with the assembly plate, and the fastening block movably assembled with the fastening hole, such that the fastening block is moved to a fastening position and fastened with the fastening hole of the rear plate, or is moved to a release position and separated from the fastening hole, selectively.

* * * * *